United States Patent
Bookbinder et al.

(10) Patent No.: US 10,741,784 B2
(45) Date of Patent: Aug. 11, 2020

(54) PATTERNED ORGANIC LIGHT EMITTING DIODE (OLED) WITH ENHANCED LIGHT EXTRACTION

(71) Applicant: Corning Incorporated, Corning, NY (US)

(72) Inventors: Dana Craig Bookbinder, Corning, NY (US); Michal Mlejnek, Big Flats, NY (US); Dean Michael Thelen, Addison, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/091,579

(22) PCT Filed: Apr. 5, 2017

(86) PCT No.: PCT/US2017/026154
§ 371 (c)(1),
(2) Date: Oct. 5, 2018

(87) PCT Pub. No.: WO2017/176888
PCT Pub. Date: Oct. 12, 2017

(65) Prior Publication Data
US 2019/0165299 A1    May 30, 2019

Related U.S. Application Data

(60) Provisional application No. 62/318,386, filed on Apr. 5, 2016.

(51) Int. Cl.
*H01L 33/00* (2010.01)
*H01L 51/52* (2006.01)

(52) U.S. Cl.
CPC ...... *H01L 51/5209* (2013.01); *H01L 51/5268* (2013.01); *H01L 51/5275* (2013.01)

(58) Field of Classification Search
CPC .............. G02B 6/03627; G02B 6/0281; G02B 6/02395; G02B 6/02009; G02B 6/0365;
(Continued)

(56) References Cited

U.S. PATENT DOCUMENTS 6,930,321 B2    8/2005    Guenther et al.
8,427,747 B2    4/2013    Le et al.
(Continued)

FOREIGN PATENT DOCUMENTS

CN    103390727 A    11/2013
CN    104282844 A    1/2015
(Continued)

OTHER PUBLICATIONS

Bocksrocker et al; "White Organic Light Emitting Diodes With Enhanced Internal and External Outcoupling for Ultra-Efficient Light Extraction and Lambertian Emission"; Optics Express, vol. 26, No. S6; Nov. 5, 2012; pp. A932-A940.
(Continued)

*Primary Examiner* — Robert G Bachner

(57) ABSTRACT

An organic light emitting diode (OLED) incorporating an enhanced light extraction apparatus in the transparent conductive oxide layer is disclosed. The apparatus for light extraction may comprise a transparent substrate, a transparent electrode comprising one or more discontinuities, and an organic light emitting material stack. The transparent electrode may be disposed on the transparent substrate and comprise a series of features or discontinuities that enhance light extraction improve energy efficiency in the OLED device. The discontinuities may be discrete or continuous and may interrupt the conductivity of the transparent conductive oxide layer.

20 Claims, 12 Drawing Sheets

(58) Field of Classification Search
CPC .............. G02B 6/0286; G02B 6/02014; G02B 6/03644; G02B 6/4434; G02B 6/02004; G02B 6/0288; G02B 6/443; G02B 6/02019; A01N 59/06; A01N 59/14; A01N 59/16; A01N 59/08; A01N 59/20; A01N 59/26; A01N 25/10; A01N 25/08; A01N 25/34; A01N 59/00; A01N 25/00
See application file for complete search history.

(56) References Cited

U.S. PATENT DOCUMENTS

| | | | |
|---|---|---|---|
| 8,486,753 | B2 | 7/2013 | Park et al. |
| 8,981,640 | B2 | 3/2015 | Levermore et al. |
| 8,981,643 | B2 | 3/2015 | Wang et al. |
| 2005/0285518 | A1 | 12/2005 | Cok |
| 2007/0077349 | A1 | 4/2007 | Newman et al. |
| 2008/0203903 | A1 | 8/2008 | De Kok et al. |
| 2008/0303435 | A1 | 12/2008 | Cok |
| 2009/0015142 | A1 | 1/2009 | Potts et al. |
| 2009/0015757 | A1 | 1/2009 | Potts et al. |
| 2011/0169027 | A1 | 7/2011 | Park et al. |
| 2013/0037787 | A1 | 2/2013 | Stromer et al. |
| 2013/0228801 | A1 | 9/2013 | Lee |
| 2014/0167085 | A1 | 6/2014 | Lee et al. |
| 2015/0008401 | A1 | 1/2015 | Lee et al. |
| 2015/0008415 | A1 | 1/2015 | Schwab |
| 2015/0014643 | A1 | 1/2015 | Lee et al. |
| 2015/0138788 | A1* | 5/2015 | Lee .......................... F21K 9/60 362/478 |
| 2015/0228929 | A1 | 8/2015 | Lamansky et al. |
| 2015/0228931 | A1 | 8/2015 | Lamansky et al. |
| 2016/0155990 | A1 | 6/2016 | Han et al. |

FOREIGN PATENT DOCUMENTS

| | | |
|---|---|---|
| EP | 2458937 A1 | 5/2012 |
| WO | 2014069573 A1 | 5/2014 |

OTHER PUBLICATIONS

International Search Report and Written Opinion of the International Searching Authority; PCT/US2017/026154; dated Jun. 26, 2017; 10 Pages; European Patent Office.

Reineke et al; "White Organic Light-Emitting Diodes: Status and Perspective"; Reviews of Modern Physics, vol. 85, Jul.-Sep. 2013; pp. 1245-1293.

* cited by examiner

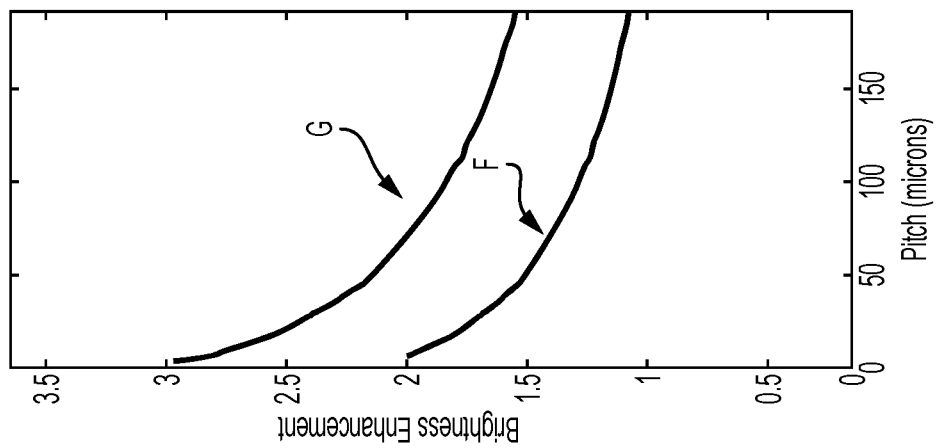
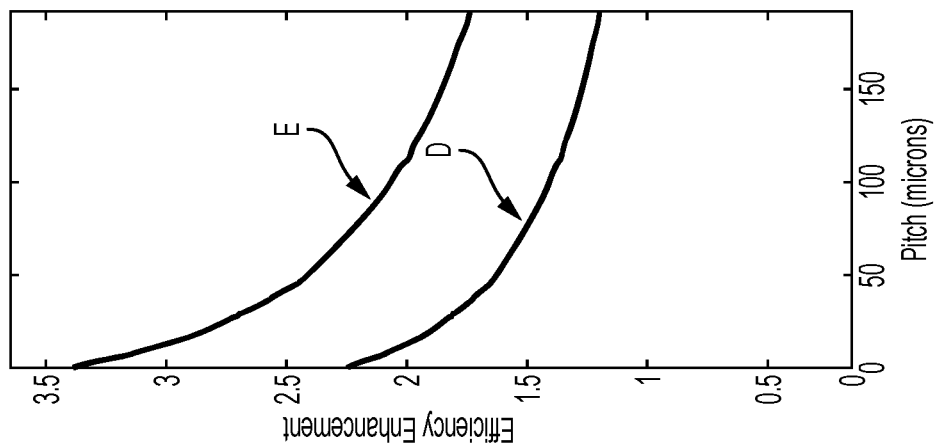
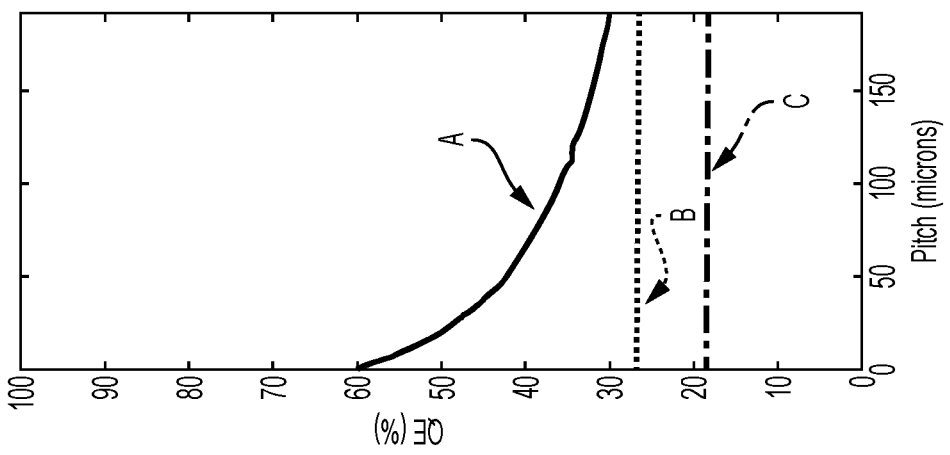

PATTERNED ORGANIC LIGHT EMITTING DIODE (OLED) WITH ENHANCED LIGHT EXTRACTION

CROSS-REFERENCE TO RELATED APPLICATIONS

This application claims the benefit of priority under 35 U.S.C. § 365 of International Patent Application Serial No. PCT/US17/26154 filed on Apr. 5, 2017, which claims priority to U.S. Provisional Application Ser. No. 62/318,386 filed on Apr. 5, 2016 the contents of which are relied upon and incorporated herein by reference in their entirety as if fully set forth below.

BACKGROUND

OLED devices offer an advantage over traditional inorganic LEDs that include color quality, diffuse light generation, and the potential for mechanical flexibility. However, current OLED device designs are not suitable replacements for inorganic LEDs in several applications, typically because of (1) lower electrical efficiency at the same light brightness level, and (2) encapsulation-related lifetime degradation.

A number of solutions have been obtained for the encapsulation-related lifetime degradation limitation, including glass-based encapsulation (including ultrathin and flexible glass substrates) as a means to increase lifetime while still enabling mechanical flexibility. However, electrical efficiency continues to be a challenge. Typically efficiency is measured as a function of the light that is emitted from the device and the efficiency of light output. Substrate structures having light extraction improvement of greater than about 2× (i.e., 2 times the external quantum efficiency of the referenced OLED device), are difficult to obtain in commercially viable structures.

The present disclosure addresses OLED efficiency by describing OLED structures with improved efficiency, wherein the OLED structures comprise patterned OLEDs with modified and patterned transparent conductors.

SUMMARY

The present disclosure relates generally to organic light emitting diodes (OLEDs) and display devices that include OLEDs, more specifically, to a patterned OLED with enhanced light extraction.

In an aspect (1), the disclosure provides an article comprising an approximately planar substrate; at least one approximately planar transparent electrode layer having a first surface and a second surface; an optional approximately planar internal light extraction layer having a first surface and a second surface, the optional internal light extraction layer located between the planar substrate and the transparent electrode such that the first surface of the planar ILEL contacts the second surface of the transparent electrode; the transparent electrode layer comprising an interrupted transparent conductive oxide structure having an index of refraction, $\eta_{tco}$, wherein the transparent conductive oxide structure has at least one discontinuity that contacts at least the first surface of the transparent conductive oxide layer; the discontinuity comprising a material having an index of refraction, $\eta_v$, sufficiently different from $\eta_{tco}$ such that the discontinuity acts as a scattering site to reduce a waveguiding effect in the transparent electrode layer, and the discontinuity has a conductivity of less than $1\times10^{-3}$ S/m at 20° C.

In an aspect (2), the disclosure provides the article of aspect (1), wherein the discontinuity contacts both the first and second surfaces of the transparent conductive oxide layer. In an aspect (3), the disclosure provides the article of aspect (1) or aspect (2), wherein the discontinuity comprises a channel, a polyhedron, or a grid of channels or polyhedrons. In an aspect (4), the disclosure provides the article of any of aspects (1)-(3), wherein the discontinuity has a width, a length, and a depth, wherein the width is at least 5× the thickness of the transparent conductive oxide. In an aspect (5), the disclosure provides the article of aspect (4), wherein the width is from 2× to 200× the thickness of the TCO layer, $t_{TCO}$. In an aspect (6), the disclosure provides the article of aspect (4) or aspect (5), wherein the article has two or more discontinuities and the mid-point distance between each pair of discontinuities is a pitch, P, wherein the pitch is from 10 nm≤P≤5 mm. In an aspect (7), the disclosure provides the article of aspect (6), wherein the ratio of the width to the pitch is <0.2. In an aspect (8), the disclosure provides the article of aspect (7), wherein the ratio of the width to the pitch is <0.1.

In an aspect (9), the disclosure provides the article of any of aspects (1)-(8), wherein the total surface area of the first surface of the transparent conductive oxide layer that comprises discontinuities is 50% or less. In an aspect (10), the disclosure provides the article of aspect (9), wherein the total surface area of the first surface of the transparent conductive oxide layer that comprises discontinuities is 10% or less. In an aspect (11), the disclosure provides the article of any of aspects (1)-(10), wherein the discontinuity forms a pattern that electrically separates the regions on opposite sides of the discontinuity. In an aspect (12), the disclosure provides the article of any of aspects (1)-(11), wherein $|\eta_{tco}-\eta_v|$ is from 0.1-1.0. In an aspect (13), the disclosure provides the article of aspect (12), $1\leq\eta_v\leq2.6$ at 600 nm. In an aspect (14), the disclosure provides the article of any of aspects (1)-(13), wherein in $1.4\leq\eta_{tco}\leq2.1$ at 600 nm. In an aspect (15), the disclosure provides the article of any of aspects (1)-(14), wherein the discontinuity has a conductivity of less than $1\times10^{-5}$ S/m at 20° C. In an aspect (16), the disclosure provides the article of aspect (4), wherein the width and depth are defined by a wall, the wall having an angle, θ, wherein θ is from 30°<θ≤90°. In an aspect (17), the disclosure provides the article of aspect (16), wherein the angle is from 45°<θ≤85°. In an aspect (18), the disclosure provides the article of any of aspects (1)-(17), wherein the at least one discontinuity forms a pattern. In an aspect (19), the disclosure provides the article of aspect (18), wherein the pattern is formed by a series of channels or polyhedrons. In an aspect (20), the disclosure provides the article of aspect (18), wherein the pattern comprises at least one channel, the channel quantified by a sinuosity index $S_{TE}$, of $1<S_{TE}\leq\pi/2$. In an aspect (21), the disclosure provides the article of any of aspects (1)-(20), wherein the transparent conductive oxide layer has a thickness of 500 nm or less.

Additional features and advantages of the present disclosure will be set forth in the detailed description, which follows, and in part will be readily apparent to those skilled in the art from that description or recognized by practicing the embodiments described herein, including the detailed description, the claims, and the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF SEVERAL VIEWS OF THE DRAWINGS

The following is a description of the figures in the accompanying drawings. The figures are not necessarily to scale, and certain features and certain views of the figures may be shown exaggerated in scale or in schematic in the interest of clarity or conciseness.

FIG. 7A is a model prediction of external quantum efficiency (QE) for the vertical-patterned embodiment (line A), such as shown in FIG. 6, versus references with (line B) and without (line C) a light extraction layer.

FIG. 7B is modeled results of external efficiency enhancement for the vertical-patterned embodiment in FIG. 7A relative to the references, where line D=(line A/line B) and line E=(line A/line C).

FIG. 7C is modeled results of external brightness enhancement for the vertical-patterned embodiment relative to the references, where line F=(brightness of the inventive embodiment)/(brightness of the reference with light extraction features) and line G=(brightness of the inventive embodiment)/(brightness of the reference without light extraction features).

Figure 1A:
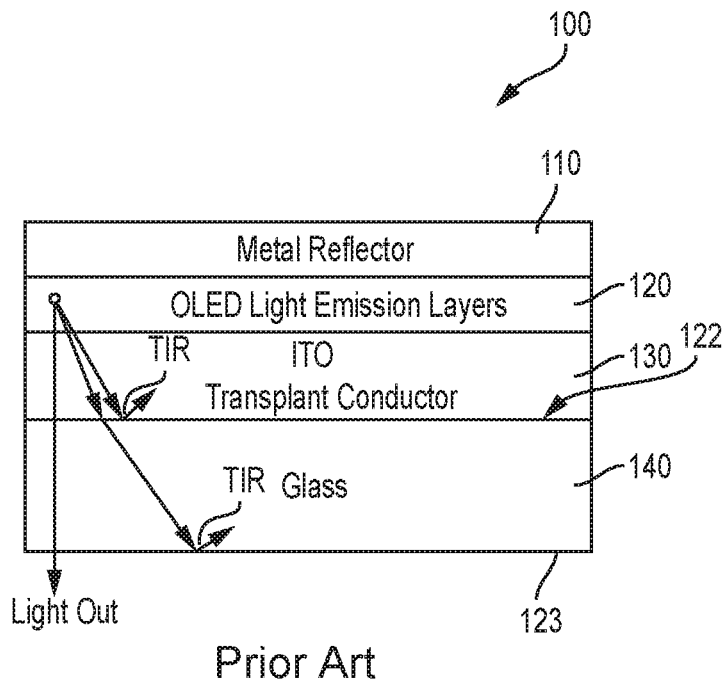
FIG. 1A is a prior art reference bottom emission OLED design, illustrating the trapping of light as a result of total internal reflection (TIR) at both the indium-doped tin oxide (ITO) transparent conductor/glass interface and glass-to-air surface, with a structure that will be referred to later in the present disclosure as "Ref. W/O light extraction."

The foregoing summary, as well as the following detailed description of certain inventive techniques, will be better understood when read in conjunction with the figures. It should be understood that the claims are not limited to the arrangements and instrumentality shown in the figures. Furthermore, the appearance shown in the figures is one of many ornamental appearances that can be employed to achieve the stated functions of the apparatus.

DETAILED DESCRIPTION

The present disclosure can be understood more readily by reference to the following detailed description, drawings, examples, and claims, and their previous and following description. However, before the present compositions, articles, devices, and methods are disclosed and described, it is to be understood that this disclosure is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the disclosure is provided as an enabling teaching of the disclosure in its currently known embodiments. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

Disclosed are materials, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed, specific reference of each various individual and collective combinations may not be explicitly disclosed, yet each is specifically contemplated and described herein.

Reference will now be made in detail to the present preferred embodiment(s), examples of which are illustrated in the accompanying drawings. The use of a particular reference character in the respective views indicates the same or like parts.

The present disclosure relates to OLED devices and addresses OLED efficiency by describing novel OLED structures comprising patterned OLEDs with modified and patterned transparent conductors. The transparent conductors may have discontinuities that act as light extraction features. The discontinuities can be discrete or continuous. In some cases, the discontinuities comprise vertical or wavy stripe patterns. The discontinuities can be partially or completely electrically dead. The discontinuity regions of the pattern may not have ITO to electrically conduct but enable an additional light extraction mechanism near each "edge." In some embodiments, no or limited electrical penalties are introduced by having "electrically dead" regions because the lack of current conduction leads to inert open circuits.

As noted above, typically efficiency is measured as a function of the light that is emitted from the device and the efficiency of light output. Substrate structures having light extraction improvement of greater than about 2× (i.e., 2 times the external quantum efficiency of the referenced OLED device), are difficult to obtain in commercially viable structures. While significant value is considered to be obtained from a ~2× efficiency improvement (including from texturing and planarizing the OLED deposition substrate), modeling results infer that the present disclosure can exceed the 2× efficiency improvement limitation by introducing the use of patterning of the transparent conductor layer, without the use of a planarization or light extraction layer. When used in combination with internal or external light extraction features, it is possible to obtain ~3× light extraction enhancement. Advantageously, the present disclosure may further include less sample-to-sample device variability and may achieve light extraction with a combination of texturing and planarizing processes. While not wishing to be bound by theory, the present disclosure can be understood as being a way to minimize the optical-electrical performance tradeoff by spatially-separating the smooth-surface electrical generation of light in one device region from the non-planar-surface light extraction in a separate device region.

Figure 1B:
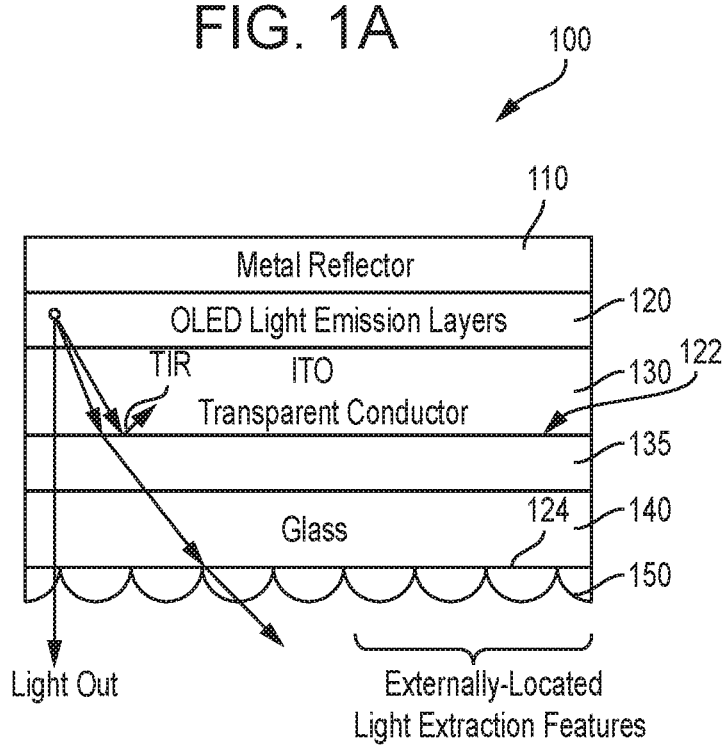
FIG. 1B is a prior art reference, illustrating less trapping of light as a result of TIR at only the ITO/glass interface because the externally-located light extraction features allow light to escape from the glass into the air, and the structure, when optional ILEL is not present, is referred to later in this document as "Ref. with external light extraction."
Figure 1C:
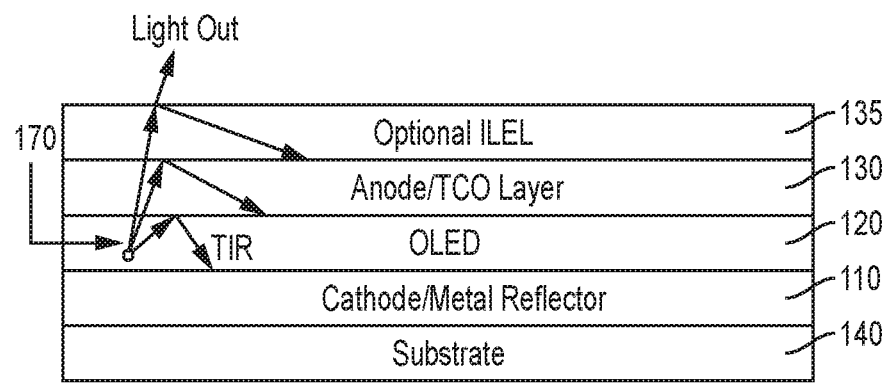
FIG. 1C is a prior art reference, illustrating a top-emission OLED design, showing that light can be lost via reflection at the interface of the OLED/anode, the anode/internal light extraction layer (ILEL), and the ILEL/air.

Looking at FIG. 1A, the prior art OLED design has a problem of low OLED electrical efficiency because a majority of the light cannot escape the OLED due to total internal reflection (TIR) at interfaces within the device. The two important TIR interfaces that reduce light extraction are (1) the transparent conductor/glass interface 122 and (2) the glass/air interface 123. Previously proposed solutions to the problem involve either internally-located (between the transparent conductor 130 and the glass substrate 140) or externally-located (between the glass substrate 140 and air) light extraction features. FIG. 1B provides a prior art OLED design featuring externally-located light extraction features 150. The externally-located light extraction features are located on the glass-to-air surface and only reduce the glass/air interface TIR reduction to enhance light extraction by an amount around 1.5× (i.e., 1.5 times external quantum efficiency relative to that of the reference OLED design). Internally-located light extraction features are typically located between the substrate and transparent conductor, but may also be found in or adjacent to the OLED and/or metal reflector layers. Internal light extraction can reduce TIR to enhance light extraction by up to about 2× (i.e., 2 times external quantum efficiency relative to that of the reference OLED design). Previous combinations of internal and external light extraction features have shown it to be difficult to go above the 2× light extraction enhancement result.

Looking at FIGS. 1A-10 again, FIGS. 1A and 1B are side views of bottom emission-type OLED devices, meaning that the light is emitted through the substrate. FIG. 10 is a side view of a top emission design, wherein light is emitted away from the substrate. As shown in FIG. 1A, an OLED device 100 comprises a metal reflector 110, OLED light emission layers 120, a transparent conductor 130, and a glass substrate 140. The light may be trapped as a result of total internal reflection (TIR) at both the indium-doped tin oxide (ITO) transparent conductor/glass interface 122 and glass-to-air surface 123. The example shown in FIG. 1B provides an optional internal light extraction layer 135 and a previously-proposed externally-located light extraction features 150 that reduce the TIR at glass-to-ELEL surface 124 by scattering light. The light may be trapped as a result of TIR at only the ITO/glass interface 122 because the externally-located light extraction features 150 allow light to escape from the glass substrate 140 into the air. To reduce the TIR at glass-to-ELEL surface 122 by scattering light, an optional ILEL 135 can be introduced. FIG. 10 provides an alternative design where an internal light extraction layer (ILEL) is present adjacent to the transparent conductive oxide (TCO) layer. In the design in FIG. 10, the ILEL reduces the amount of light that would be reflected at the interface of the TCO-air interface.

The present disclosure incorporates new designs to improve light output in OLED devices. Light scattering is improved by the introduction of discontinuities in the TCO layer. Discontinuities, as used herein, means one or more regions within the TCO layer that have different refractive indices than the TCO layer. The discontinuities may comprise voids, particles, or geometric shapes within the TCO layer, such as channels or polyhedrons, such as cones, cylinders, cuboids, spheres, triangular prisms, etc. Channels may run the entire length of the sheet or may be fractions of the sheet and may have lengths from 1 μm to 100 μm to the entire sheet length.

Figure 2A:
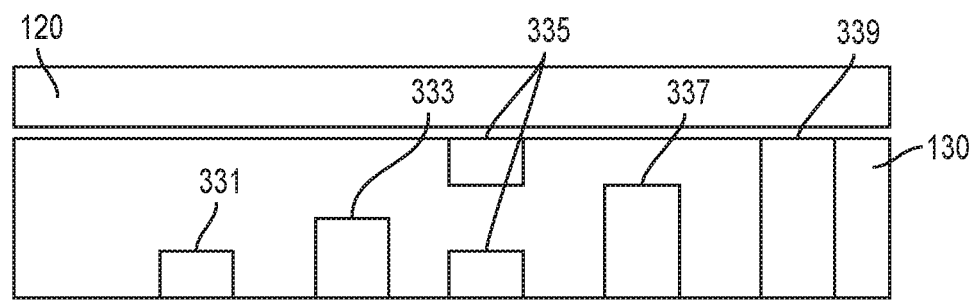
FIG. 2A is a side view of a patterned OLED design according to an embodiment.

FIG. 2A provides a side view of the TCO layer 130 adjacent the OLED layer 120 with a number of embodied discontinuities. Discontinuities 331 and 337 contact the OLED-TCO interface and go partially into the TCO layer and each has an approximately flat bottom surface. Discontinuity 333 contacts the OLED-TCO interface and goes partially into the TCO layer, however has a curved bottom surface that may help with light output. Discontinuity 335 comprises two discontinuities that are spatially separated with one on at the top interface and one at the bottom interface. Discontinuity 339 goes completely through the TCO layer. While the discontinuities are shown with particular shapes and edges, any and all could also comprise alternate shapes as desired to optimize light output.

Figure 2B:
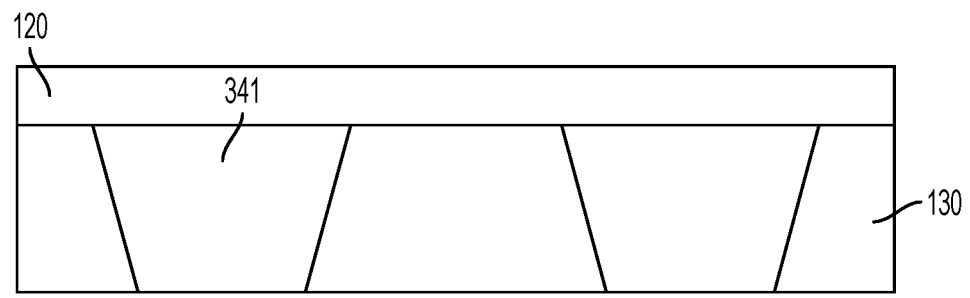
FIG. 2B is a side view of a patterned OLED design according to an embodiment.
Figure 2C:
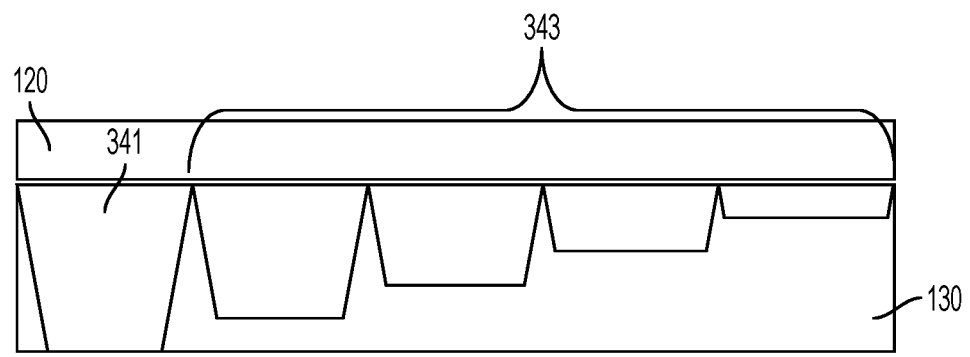
FIG. 2C is a side view of a patterned OLED design according to an embodiment.
Figure 2D:
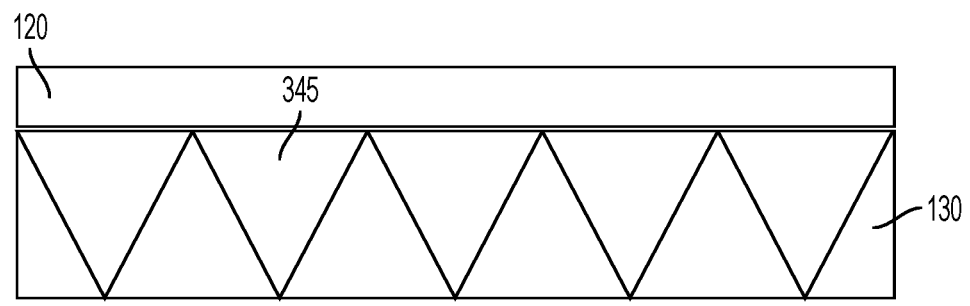
FIG. 2D is a side view of a patterned OLED design according to an embodiment.

Now turning to FIG. 2B, the figure shows another embodiment in cross-section, where the discontinuity 341 in the TCO 130 has a tapered shape that narrows away from the OLED layer 120. Continuing to FIG. 2C, similar tapered discontinuities are shown, where the discontinuity 341 completely traverses the TCO layer 130, and where other example embodiments 343, while they contact the OLED-TCO interface, only partially traverse the TCO layer. FIG. 2D provides another alternative, where the discontinuities take on a sawtooth cross section 345 that may optionally traverse the entire TCO layer and while shown abutting one another, may be farther apart than shown.

The transparent conductive oxides used in the articles described herein can comprise essentially any TCO material. Example TCO materials include indium tin oxide (ITO), fluorine doped tin oxide, aluminum doped zinc oxide, barium stannate, strontium vanadate, calcium vanadate, and the like. While not transparent conductive oxides per se, comparable materials that in some embodiments may also be used or comprise the transparent conductive layer include conductive polymers, such as poly(3,4-ethylenedioxythiophene), carbon nanotubes, graphene, and metal grids, meshes, and films.

The TCO layers used herein can generally have thicknesses typically seen in electronic devices that utilize TCO layers. The thickness of the TCO layer may be a function of the surface roughness of the substrate or ILEL, or may be a function of the desired size of the discontinuities. For example, the TCO layer may have a thickness, $t_{TCO}$, of 10 nm≤$t_{TCO}$≤2 µm, or 50 nm≤$t_{TCO}$≤2 µm, 100 nm≤$t_{TCO}$≤1 µm, 30 nm≤$t_{TCO}$≤200 nm, 200 nm≤$t_{TCO}$≤1 µm, or 200 nm≤$t_{TCO}$≤700 nm.

The refractive index of the TCO layer, $\eta_{TCO}$, is a function of the material is comprises. In order to improve light output, the discontinuities need to have a refractive index, different than the TCO layer. In some embodiments, the absolute difference between $\eta_{TCO}$ and $\eta_v$:

$$|\eta_{TCO}-\eta_v|\geq 0.05$$

wherein $|\eta_{TCO}-\eta_v|$ is measured at 600 nm and 25° C. In some embodiments, $|\eta_{TCO}-\eta_v|$ is equal or greater than 0.05, 0.1, 0.2, 0.3, 0.4, 0.5, 1.0, 1.5, or 2.0. In some embodiments, $|\eta_{TCO}-\eta_v|$ is from 0.05 to 0.5, 0.1 to 0.5, 0.05 to 0.3, or 0.05 to 0.2. In some embodiments, $|\eta_{TCO}-\eta_v|$ is 2. In some embodiments, $|\eta_{TCO}-\eta_v|$ is ≤1. In some embodiments, $|\eta_{TCO}-\eta_v|$ is 0.5.

Figure 3A:
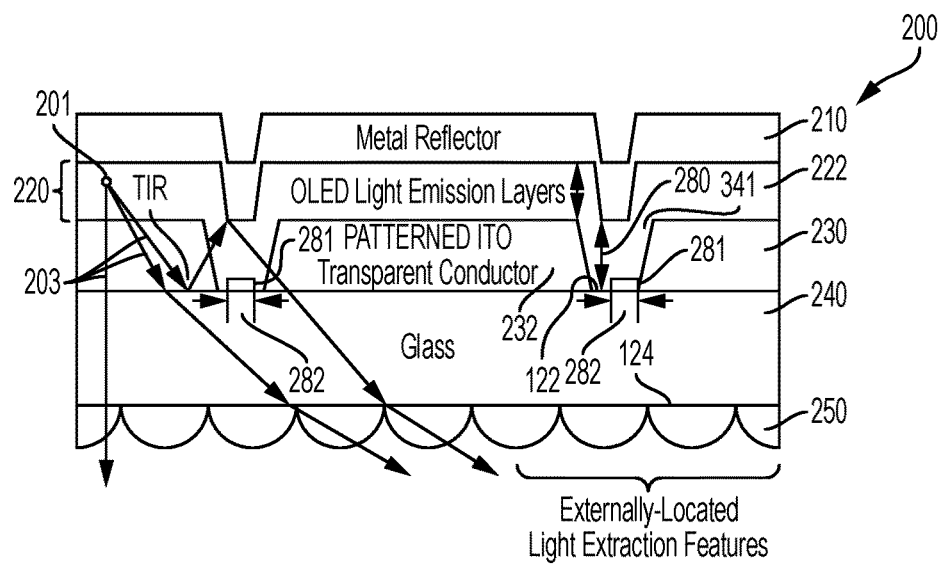
FIG. 3A is a side view of a patterned OLED design according to one embodiment.
Figure 3B:
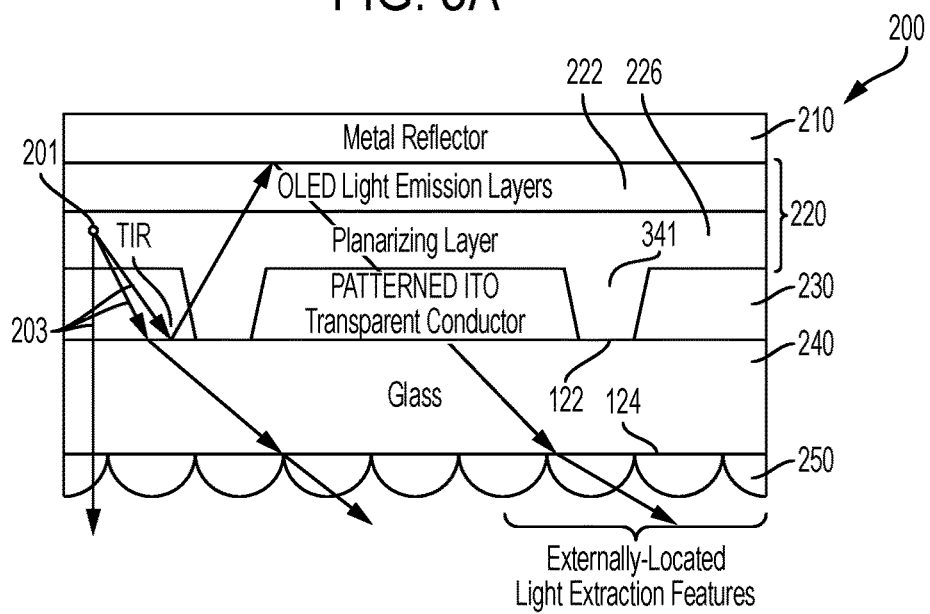
FIG. 3B is a side view of a patterned OLED design according to another embodiment.
Figure 3C:
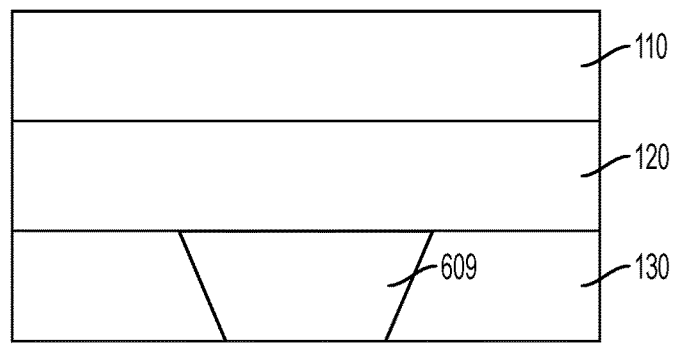
FIG. 3C is a side view of a patterned OLED design according to a third embodiment.

FIGS. 3A-3C provide example embodiments incorporating discontinuities into the TCO layer. As shown in FIG. 3A, an OLED 200 may comprise a transparent substrate 240, at least one transparent electrode 230, a discontinuity 341, an organic light emitting material stack 220, and a reflective electrode 210. The at least one transparent electrode 230 may be disposed on the transparent substrate 240. The transparent substrate 240, such as glass, may have texture 281 or may not have texture, and may have an optional external light extraction layer 250. The glass texture 281 may be random or structured. The glass texture 281 may be patterned having a minimum width 282. The glass texture may be patterned to minimize electrical degradation. In the embodiment shown in FIG. 3A, at least one portion of the organic light emitting material stack 220 may be disposed on the transparent substrate 240.

Patterning for one or more of the layers can be achieved by deposition and patterning processes generally known in the art. Deposition processes include typical thin film deposition processes, such as chemical vapor deposition (CVD), plasma enhanced CVD, atomic layer deposition, spin coating, plating, chemical solution deposition, dip coating, vacuum thermal or laser deposition, chemical reaction or cross polymerization, physical vapor deposition including molecular beam epitaxy, sputtering, pulsed laser deposition, cathodic arc deposition, and electrohydrodynamic deposition, printing, such as ink jet printing. Patterning can be achieved in combination with any of the above deposition processes via typical processes such as lithography, such as optical or photolithography, masking, masking and etching, masking and depositing multiple layers, laser ablation of the layer from the top or through the transparent substrate the layer is deposited there on, printing, such as screen printing, ink jet printing, laser thermal printing, microcontact printing, embossing, lamination, thermal decomposition of one or more layers or regions and combinations thereof. and other methods.

The substrate can be any material typically used in OLED design. In bottom-emission OLED, the substrate is a transparent material and may comprise a polymer, glass, or glass ceramic. In some embodiments, the substrate is a glass, such as a thermally or chemically tempered glass.

The OLED as described herein includes the various emissive and charge transfer layers along with any other layers in the OLED stack. OLED materials can be polymers, small molecules, and/or phosphorescent materials. Typical methods for patterning OLEDs can be used, such as various printing methods.

Internal light extraction layers (ILEL) comprise various partial or full layers of materials located between the TCO and the substrate that are designed to increase light extraction from the device. They may include inorganic or organic materials or combinations thereof. For example, the ILEL may comprise a polysiloxane matrix with rutile or silicon particles in it. Similarly, external light extraction layers (ELEL) comprise various partial or full layers of materials located between the TCO and the substrate that are designed to increase light extraction from the device. ELELs may include inorganic or organic materials or combinations thereof.

The cathode/metal reflector is generally known and can comprise a metal, such as aluminum, copper or silver, or may, in some embodiments, comprise a transparent conductive oxide.

The organic light emitting material stack 220, which include OLED light emission layers 222, may, in some embodiments, be introduced into the discontinuities and optionally separate the at least one transparent electrode 230 into a plurality of isolated transparent electrodes 232. As noted above, the material, in this case, the OLED, in discontinuity should have a refractive index different than the TCO layer. In some embodiments, the OLED light emitting layers 222 may have uniform thickness 280 (defined as OLED_emitting_layer_thickness) in a vertical direction. The uniform thickness 280 of the OLED may be realistic for typical OLED deposition methods. In some embodiments, since the OLED light emitting layer 222 may be deposited onto the transparent electrode 230, the OLED light emitting layer 222 may have the minimum OLED texture width (defined as Min_OLED_texture_width) the same as the minimum width 282 of the glass texture 281.

The plurality of isolated transparent electrodes 232 may be in contact with the organic light emitting material stack 220. The plurality of isolated transparent electrodes 232 exhibits a pattern. The reflective electrode 210, such as a metal, may be opposite the transparent substrate 240. The reflective electrode 210 may exhibit a complementary pattern, such as non-flat with upside down trapezoid, to the transparent electrode pattern as shown in FIGS. 3A and 3B.

Figure 4:
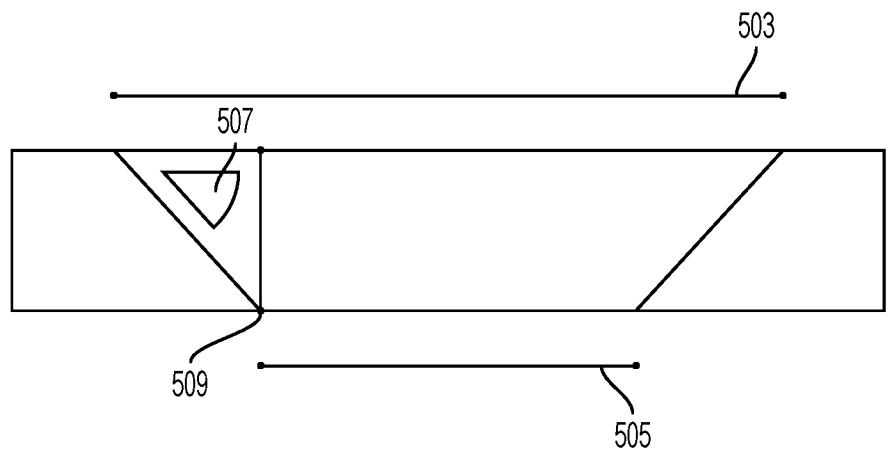
FIG. 4 is a side view of a discontinuity having a side wall having an angle θ.

Still viewing FIG. 3A, optionally, the plurality of transparent electrodes 232 may be parallel to each other and may form a pattern via the discontinuities 341. The isolated electrodes 232 may have a trapezoid shape cross-sectionally with a certain height as shown in FIG. 3A or may have any of the other shapes described herein. The angle of the wall in the cross section can be optimized for light extraction based on the refractive indices of the TCO and material in the discontinuity, as well as other optical parameters. As shown in FIG. 4, the angle, θ, 507 describes the wall angle of the cross section. In some embodiments, the wall angle is from 30° to 90°. In some embodiments, the wall angle, θ, is from 45° to 75°. In some embodiments, the wall angle, θ, may even be larger than 90°.

The plurality of isolated transparent electrodes 232 with the discontinuities may improve light exaction. The transparent substrate 240 may comprise optional light extraction features 250. The light extraction features 250 may comprise external light extraction features. Alternatively, an additional layer of internal light extraction features may be present between the TCO layer 230 (and OLED layer 220 where it contact the substrate 240) and the substrate layer 240. The external light extraction features may comprise at least one of grooves, prisms, particles, hemispherical features, or other geometric features. The light extraction features 250 may further improve the light exaction.

FIG. 3B shows another embodiment of the present disclosure. The organic light emitting material stack 220 of the OLED 200 may comprise a light emitting layer 222 and a planarizing layer 226. The planarizing layer 226 may also comprise a carrier transport enabling layer. The planarizing layer may be deposited after the patterned transparent conductor 230 and should have a refractive index than the TCO layer. The planarizing layer may need to be conductive depending on the stack details.

FIG. 3C is a simplified alternative to FIGS. 3A and 3B, wherein the discontinuity 609 alone incorporates a material (or void) and the OLED layer 120 and the metal reflector 110 are approximately planar. In some embodiments, FIG. 3C could mimic FIG. 3B, except that the planarizing layer 226 is limited in thickness such that it only fills the discontinuities.

In operation, as shown in FIGS. 3A and 3B, a light source 201 emits light rays 203 in various directions. When the light rays 203 hits the metal reflector 210, it will reflect back to the light emission layer 222. Light incident from a high index material onto an interface with a lower index medium will undergo total internal reflection (TIR) for all incidence angles greater than the critical angle $\theta_C$, defined by $\theta_C=\sin^{-1}(\eta_2/\eta_1)$, where $\eta_1$ and $\eta_2$ are the refractive indices of the high and low index regions, respectively. The electromagnetic field associated with the totally internally reflected light extends into the lower-index region in an evanescent standing wave, but the strength of this field diminishes exponentially with distance from the interface. Absorbing or scattering entities located within this evanescent zone, typically about one wavelength thick, can disrupt the TIR and cause the light to pass through the interface. Therefore, in order to optimize the amount of interaction between the discontinuities and the evanescent wave, the discontinuities need to be near or on the interface of the TCO and OLED material.

Figure 5:
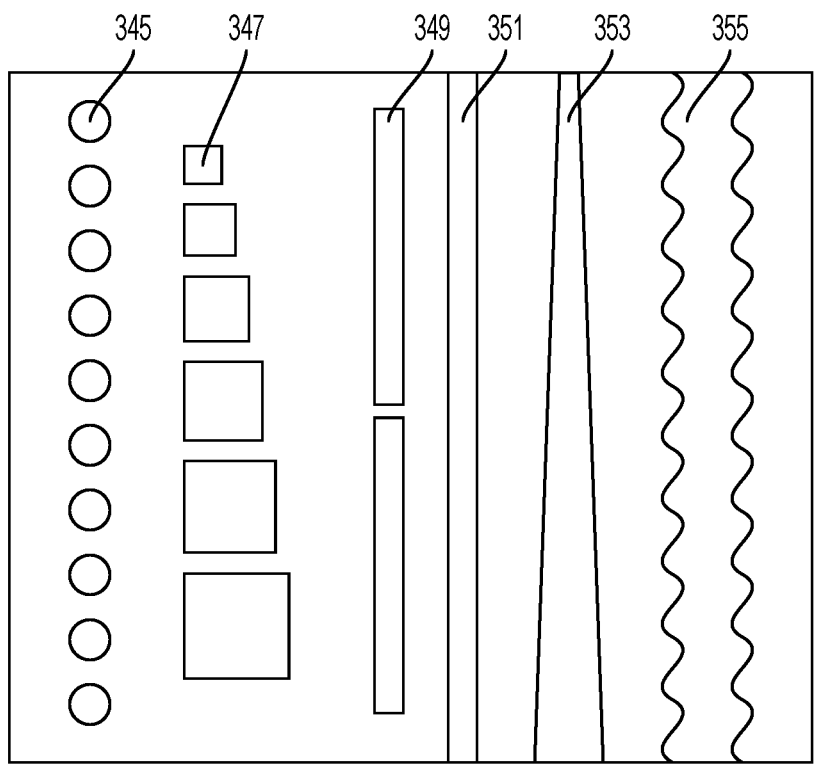
FIG. 5 is a top down view of a number of embodied discontinuities.

FIG. 5 is a top-down view of the face of the OLED, showing examples of discontinuity shapes and sizes. The discontinuities can have any number of shapes when viewed top-down, including circular 345, square 347, rectangular, linear 349 and 351, as in the case of a channel, where the channel may change dimensionally by getting wider or narrower, as shown in 353 or larger as in 347. The discontinuities may also be curved or sinusoidal 355. In some embodiments, the size and shape of the discontinuities is designed or determined to make the perceived (as by unaided eye of the viewer situated approximately orthogonal to the emission surface) or actual output of the light emission uniform. In some embodiments, the size of the discontinuities or spacing of the discontinuities changes in a constant, linear, nonlinear, or exponential manner across the face of the OLED. These changes may be in a single direction (for example, the spacing or discontinuities get bigger as one moves in one direction across the OLED) or they may be multi directional (chance in multiple directions or make multiple changes in the same direction, such as getting exponentially bigger near the center and smaller near the edges, which, in some embodiments, could either make the center brighter or may compensate for viewer perception that makes an equal luminescent screen seem darker in the center).

The size of the discontinuities can vary or be optimized for light output. In some embodiments, the overall surface area of the discontinuities at the interface comprises 50% or less. In some embodiments, the overall surface area of the discontinuities at the interface comprises 20% or less. Because the discontinuities can break the electrical connection between the OLED and the TCO, they can affect the light emission from the material directly above the discontinuity. In such embodiments, light output may be maximized by limiting the overall surface area of the discontinuities at the interface to 10% or less.

The discontinuities can be discrete, as shown in 345, 347, and 349, or continuous, such as those shown in 351 and 353. Discrete discontinuities may allow for current flow along the entire TCO layer. Continuous discontinuities create breaks in the TCO that limit current flow between regions of the TCO. In some embodiments, the discrete discontinuities, such as those in 349, are aligned such that current flow is minimally impacted by the discontinuity. This can be done by aligning or shaping the discontinuities so that they don't form barriers or regions to electron flow.

In some embodiments, the discontinuities create electrically retarded or dead regions. The discontinuities in such regions can have conductivities lower than the TCO regions around them. For example, the conductivity of the discontinuities, $\sigma_{DSC}$, can be $1\times10^{-3}$ S/m at 20° C. or less, $1\times10^{-4}$ S/m at 20° C. or less, $1\times10^{-5}$ S/m at 20° C. or less, $1\times10^{-6}$ S/m at 20° C. or less, $5\times10^{-7}$ S/m at 20° C. or less, or $1\times10^{-7}$ S/m at 20° C. or less. In some embodiments $1\times10^{-3}$ S/m$\leq\sigma_{DSC}\leq1\times10^{-25}$ S/m at 20° C. In some embodiments $1\times10^{-5}$ S/m$\leq\sigma_{DSC}\leq1\times10^{-25}$ S/m at 20° C. In some embodiments $1\times10^{-8}$ S/m$\leq\sigma_{DSC}\leq1\times10^{-25}$ S/m at 20° C. In some embodiments $1\times10^{-16}$ S/m$\leq\sigma_{DSC}\leq1\times10^{-25}$ S/m at 20° C. In some embodiments $1\times10^{-12}$ S/m$\leq\sigma_{DSC}\leq1\times10^{-25}$ S/m at 20° C.

In some embodiments, the spacing of the TCO active region(s) and the discontinuities impact the light output efficiency. Looking at FIG. 6, which is a top view of an embodiment shown in FIG. 3A, a plurality of isolated transparent electrodes 232 are separated by a distance defined as a width W. While the figure provides linear, channel type discontinuities, the language here is equally applicable to other shapes/designs. In some embodiments, the width W can be from about 2× to 200×, 2× to 100×, 2× to 500×, 2× to 25×, 4× to 10×, or 5× to 8× the thickness of the TCO layer, $t_{TCO}$. In some embodiments, 20 nm$\leq$W$\leq$5 mm. In some embodiments, 200 nm$\leq$W$\leq$5 mm. In some embodiments, 1 μm$\leq$W$\leq$5 mm. In some embodiments, 1 μm$\leq$W$\leq$1 mm. In some embodiments, 1 μm$\leq$W$\leq$100 μm. In some embodiments, 10 μm$\leq$W$\leq$1 mm. In some embodiments, the shorter the width W, the better efficiency and brightness enhancement. In some embodiments, the width is optimized around 4-6× the thickness of the TCO layer.

Figure 6:
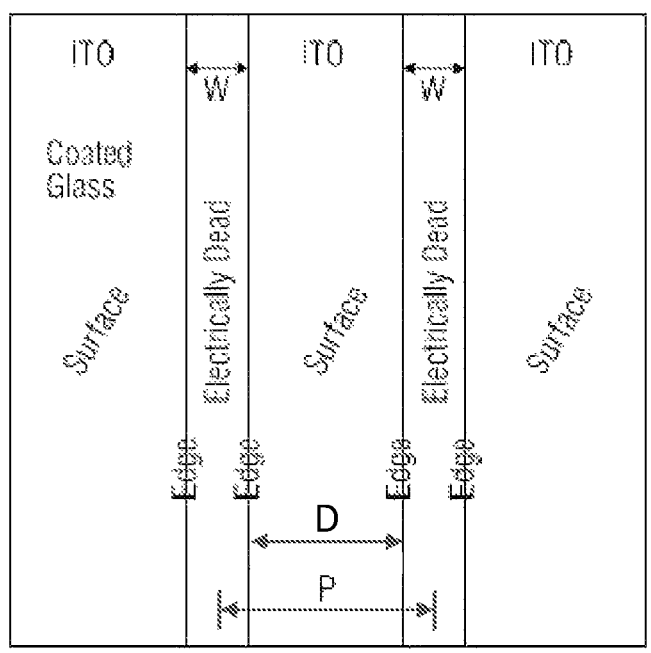
FIG. 6 is a top view of a vertically-striped patterned OLED according to one embodiment.

Again looking at FIG. 6, the pitch, P, or spacing between the centers of discontinuities in this structure, can be 10 nm$\leq$P$\leq$5 mm. Additionally, each of the transparent electrodes 232 may have a certain width distance D. In some embodiments, 1 μm$\leq$P$\leq$5 mm. In some embodiments, 10 μm$\leq$P$\leq$1 mm. In some embodiments, 1 μm$\leq$P$\leq$50 mm. In some embodiments, 100 μm$\leq$P$\leq$50 mm. In some embodiments, 1 μm$\leq$P$\leq$5 mm. Generally, the shorter the pitch P, the better efficiency and brightness enhancement. The ratio of the pitch to the width (P/W) may be from 10 to 0.1, 5 to 0.1, 2 to 0.1, 0.5 to 0.1, 5 to 0.2, 5 to 0.5, but in some embodiments, is typically less than about 0.1 to avoid a significant brightness penalty, which may reduce the benefit to patterned efficiency when required to obtain the same brightness level as the non-patterned reference.

OLED efficiency may be a function of brightness. More specifically, efficiency values may typically decrease at higher brightness for an OLED design. Therefore, when the efficiency enhancement of a patterned-transparent-conductor OLED is measured relative to a reference (non-patterned) OLED, any low-brightness sample must be operated at higher voltage to maintain brightness, reducing some (or all) of the efficiency improvement.

The width W may be further limited by either fabrication resolution for the transparent substrate texture, such as glass texture or avoiding significant electrical degradation for the transparent substrate having textures by having W greater than a sum of a minimum OLED texture width and 5 times of the thickness of the organic light emitting diode layers.

$$W > \sim \{5 \ast OLED\_emitting\_layer\_thickness + Min\_OLED\_texture\_width\}$$

The enhancement of light extraction efficiency is defined as a function of the width W and the pitch P to be:

$$Enhancement_{Efficiency}(W, P) = \frac{QE_{patterned}(W, P)}{QE_{reference}} \quad (1)$$

where $QE_{patterned}$ is the external quantum efficiency of the patterned OLED design of this disclosure, and $QE_{reference}$ is the external quantum efficiency of the Reference OLED design. The brightness will not be enhanced as much as the efficiency because the "electrically dead" regions may lose their current conduction and light generation. Specifically, the enhancement of brightness will be less than the efficiency enhancement as given by the expression:

$$Enhancement_{Brightness}(W, P) = Enhancement_{Efficiency}(W, P)\left[1 - \frac{W}{P}\right]. \quad (2)$$

Modeling shows that the QE enhancement differs qualitatively from that of previously-proposed internally-located light extraction features. In particular, the QE for the reference and previously-proposed internally-located light extraction features may only contain the extraction from the surface that is not prevented by TIR, i.e., $$QE_{reference\ or\ previous\ internal} = Probability_{Surface}(scattering) \quad (3)$$

where "scattering" is the amount of light scattering. "Scattering" is negligible for the reference case. "Scattering" is significant for the previously-proposed internally-located light extraction features (i.e., planarizing layer), resulting in enhanced light extraction probability by preventing TIR after one or more scattering events occur. For this invention of a patterned OLED, $$QE_{patterned}(W,P) = Probability_{Surface}(W,P) + Probability_{Edges}(W,P) \quad (4)$$

where the scattering enhancement mechanism (that is limited in impact by electrical constraints) is supplemented by the introduction of an edge extraction mechanism (that is not limited in impact by electrical constraints) as shown in FIG. 3. Finite values for the parameters of pattern width W and pitch P slightly reduce the $Probability_{Surface}$ contribution relative to the reference, but the $Probability_{Edges}$ term is expected to extract significantly more light.

Modeling may be used to predict the embodiments with ≥2× light extraction improvement. The model may be described along with corresponding results that predict embodiments with up to a 3× and greater light extraction improvement. FIG. 3 shows a top view of this concept. "ITO" may refer to the patterned transparent conductor regions corresponding to the isolated transparent electrodes 232 of FIG. 2a. The "Surface" regions may be where light extraction occurs in the reference and other previously-proposed enhanced light extraction approaches. The "electrically dead" regions of the pattern do not have ITO, but enable an additional light extraction mechanism near each "edge." No electrical penalties are introduced by having "electrically dead" regions because the lack of current conduction leads to inert open circuits.

Corresponding model results for the patterned OLED are shown in FIGS. 7A-7C. FIGS. 7A-7C show the model predictions of external quantum efficiency (QE), efficiency enhancement, and brightness enhancement for the vertical-pattern embodiment of the disclosure as illustrated in FIG. 6, assuming 100% complete extraction of light that strikes each "edge." FIG. 7A is modeled results of external quantum efficiency (QE) for the vertical-patterned embodiment (line A) versus references with (line B) and without (line C) a light extraction layer. FIG. 7B is modeled results of external efficiency enhancement for the vertical-patterned embodiment in FIG. 7A relative to the references, where line D=(line A/line B) and line E=(line A/line C). FIG. 7C is modeled results of external brightness enhancement for the vertical-patterned embodiment relative to the references, where line F=(brightness of the inventive embodiment)/(brightness of the reference with light extraction features) and line G=(brightness of the inventive embodiment)/(brightness of the reference without light extraction features). The "QE Ref W/O light extraction" curve, line C, refers to the reference case without external light extraction features on the glass surface as shown in FIG. 1A, and was modeled at 1.5× lower than the "QE Ref W/light extraction" curve, line B for the reference case with external light extraction features on the glass surface as shown in FIG. 1B. Looking at FIGS. 7B and 7C, it can be seen that reducing the pitch value enhances the corresponding efficiency and brightness enhancements by more than 2× (i.e., up to ~3×) as a result of larger contributions from the edge extraction mechanism. In some embodiments, the efficiency or brightness enhancements are greater than 1.5×, 1.8×, 2.0×, 2.2×, 2.5×, 2.7×, or 3× when compared to a reference device comprising a reference device having the same OLED structure, but no light extraction structures and no TCO patterning. Reducing the pitch value further to obtain even higher enhancement values is not considered achievable (for reasons of device fabrication practicality and model prediction accuracy) as the pitch approaches the OLED thickness. In some cases, it is impractical or undesirable for the pitch to be below about 5× to about 20×, about 5× to about 15×, or about 8× to about 12× the OLED thickness.

Figure 8A:
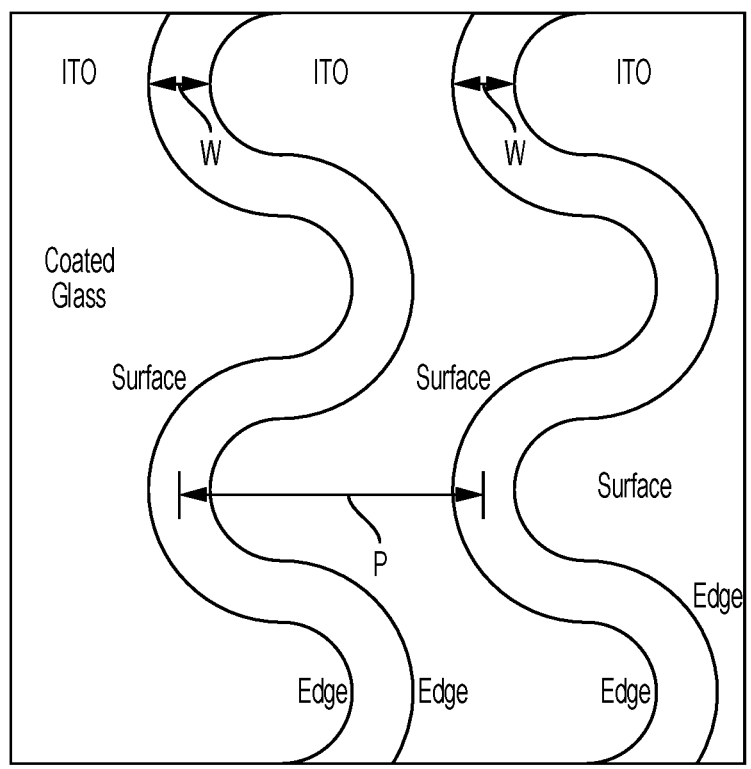
FIG. 8A is a top view of a wavy-patterned OLED according to another embodiment of the invention.
Figure 8B:
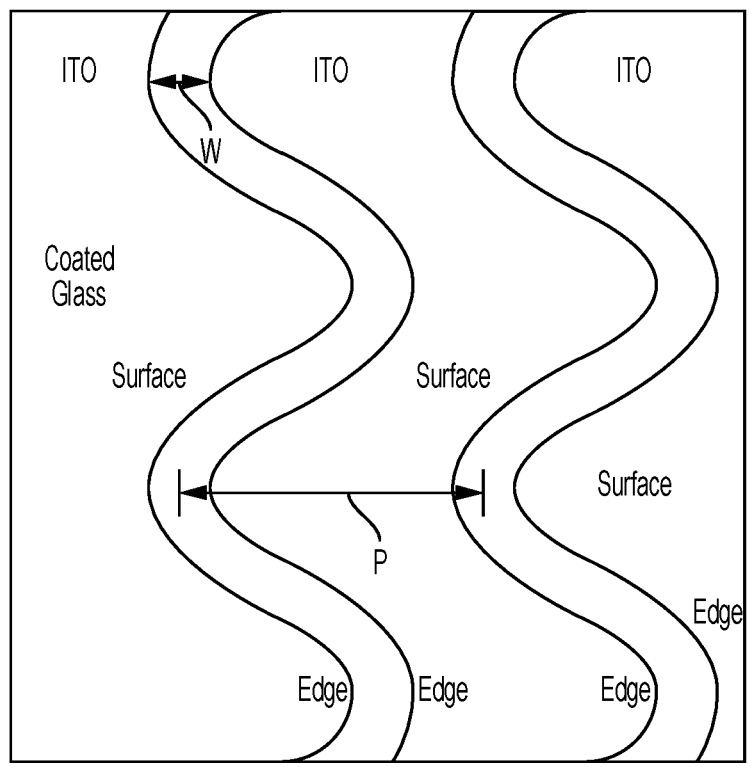
FIG. 8B is a top view of a sinusoidal-patterned OLED according to another embodiment of the invention.

The model results correspond to the invention embodiment of FIG. 6 that consists of a vertically-striped pattern, but other patterns are possible. Which pattern is optimal depends on (1) the performance factor that is limiting applications of specific consumer device application such as whether the limit is the absolute brightness, electrical efficiency, etc., and (2) OLED device design and material properties such as the transparent conductor sheet resistance. To generate a set of patterns that is expected to contain the optimal embodiment for many consumer device applications, the vertically-striped pattern of the discontinuities, having a width, W, is generalized to also include waviness with a component in the horizontal direction. FIG. 8A shows an exemplary wavy curve (circular shape), which can be referred to as having the quality of sinuosity. FIG. 8B further shows an example of sinusoidal shaped isolated transparent electrodes. The amount of sinuosity is defined quantitatively by a sinuosity index (SI). The sinuosity index may be defined as a ratio of the curvilinear length (along the curve) and the Euclidean distance (straight line) between the end points of the curve. Each consumer device application is expected to have an SI value that provides optimal benefit for the specific application need. Low SI values, such as the vertical-pattern or straight pattern of FIG. 6 with SI is about 1, may typically be optimal for consumer device applications that are efficiency-limited and/or have a large area (where the waviness increase to the transparent conductor conduction path from higher SI is not desired as it leads to efficiency degradation from increased Ohmic conduction loss). High SI values, such as the exemplary circular-shape of FIG. 8A with SI is about $\frac{1}{2}\pi$, may typically be optimal for consumer device applications that are brightness-limited and/or have small area. Sinusoidal-shaped isolated transparent electrodes may have sinuosity, $S_{TE}$, of $1 < S_{TE} \leq \frac{1}{2}\pi$. In some embodiments, $1.1 \leq S_{TE} \leq \frac{1}{2}\pi$. In some embodiments $1.1 \leq S_{TE} \leq 1.4$. In some embodiments $1.1 \leq S_{TE} \leq 1.3$. This waviness could potentially be leveraged for other purposes, such as varying the cosmetic appearance of the emitted light. The waviness may help to minimize electrical current crowding. The wave curve region may contain patterned glass surface texturing to further enhance the light extraction closer to the ideal limit.

EXAMPLES

To investigate the approaches described, experimental fabrication and measurement steps are performed. The fabrication steps consist of producing OLED optical surrogate structures, which may differ from a complete OLED electro-optic device in that (1) they are easier to fabricate and test than complete devices, and (2) they only provide an estimate to the optical device behavior, without any electrical degradation information. The optical surrogate fabrication includes both reference and pattered-transparent-conductor designs so that the reference case may help identify any experimental fabrication and/or measurement issues. The measurement step consists of optical illumination with an ultraviolet source and capturing images with a camera.

Figure 9:
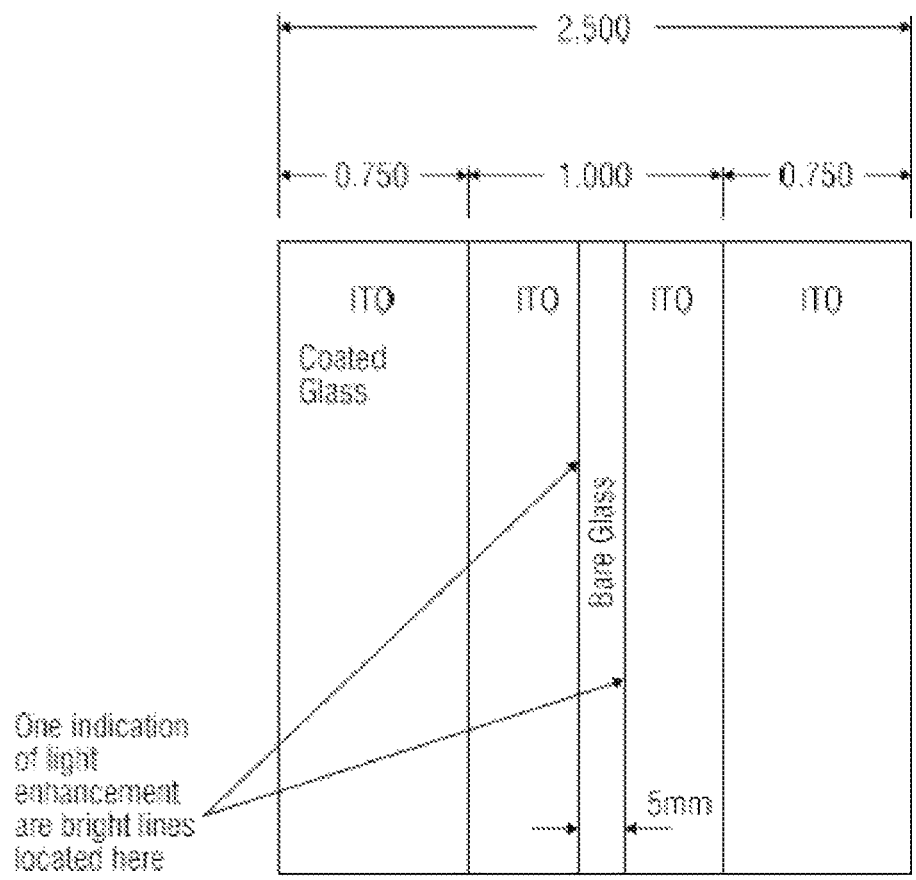
FIG. 9 is a top view of a patterned-transparent-conductor optical surrogate experiment according to one embodiment.
Figure 10:
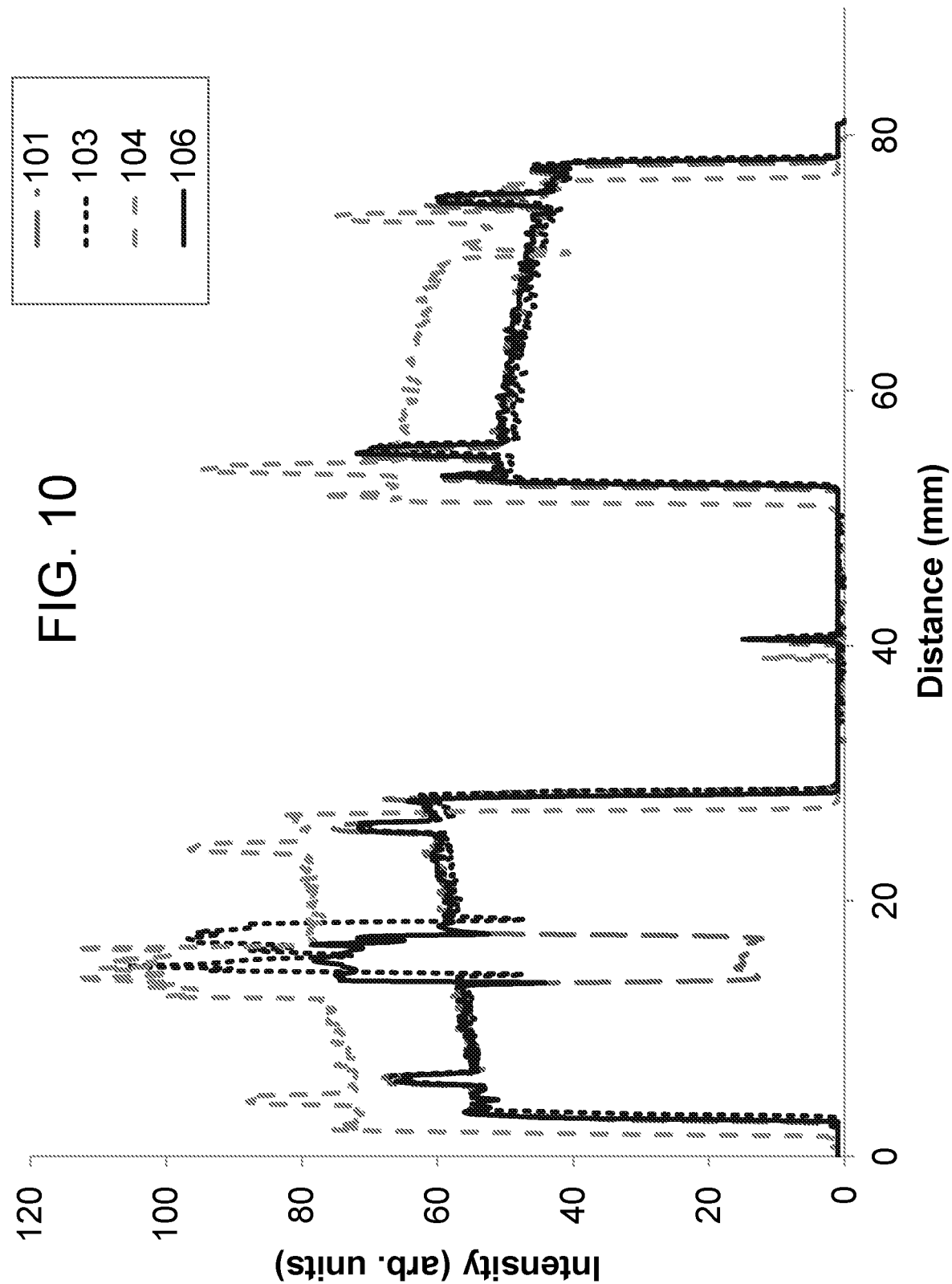
FIG. 10 illustrates raw illumination data on samples incorporating aspects of the embodiments disclosed herein.

FIG. 9 illustrates the design of the patterned-transparent-conductor optical surrogate experiment. The "bare glass" region in the center represents the additional patterning of the transparent conductor ITO and the length units are in inches. The additional patterning of the transparent conductor is about 5 mm wide section in the middle. The patterning was achieved by a simple masking tape approach, which was found to introduce a small amount of contamination from residue masking tape adhesive. Illumination data were collected on these samples even though quantitative light extraction efficiency was not estimated. FIG. 10 shows the output of four different samples that were fabricated with patterned transparent conductor designs similar to that shown in FIG. 9. Sample 101 had an unlit region at about 15-18 mm where the TCO was patterned. However, all the other samples, 103, 104, and 106, showed increased light intensity at the patterned region.

Figure 11:
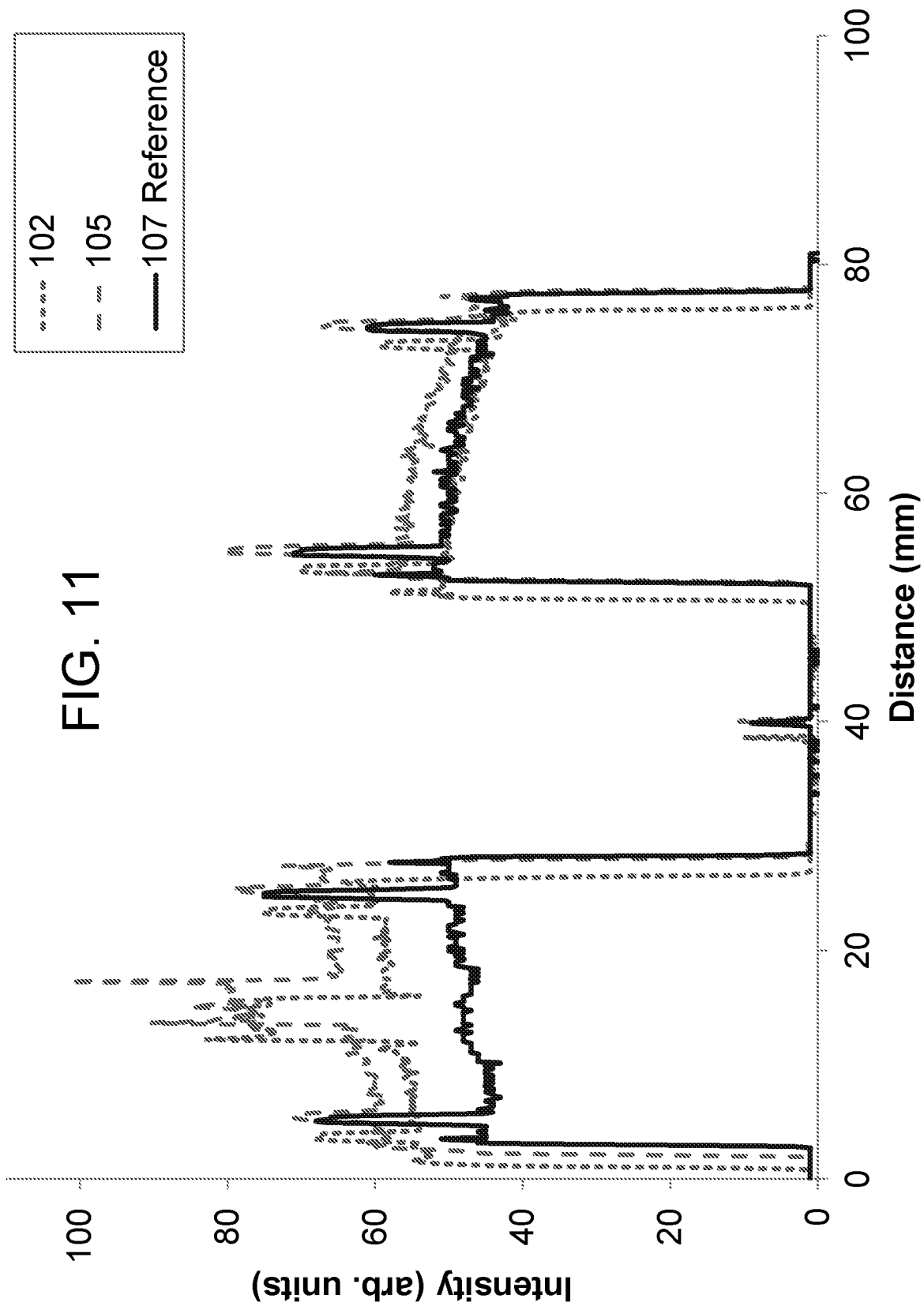
FIGS. 11 and 12 illustrate processed data on samples. The data in FIG. 12 was obtained by scaling and shifting the raw data from FIG. 11 to match the reference curves shown at the right (i.e., match the 3 curves within the ~50 to ~75 mm distance range).

FIG. 11 provides additional samples, where two of the samples (102 and 105) are fabricated with the patterned transparent conductor design shown in FIG. 9 and one of the samples (107) is fabricated with the reference design. Samples with serial numbers 102 and 105 exhibit images that are expected for an optical surrogate fabricated with the patterned transparent conductor shown in FIG. 9. The sample labeled with the serial number 107 is an additional reference, which is included to minimize potential measurement issues due to calibration or symmetry in the spectrometer are minimized. FIG. 11 shows the raw intensity data that was obtained along vertical slices of the samples. There are noticeable differences between the right-hand-side intensity data even though the identically-same reference sample is used. These differences are measurement-related and are used to provide calibration information to enable the minimization of measurement errors on the FIG. 11 left-hand-side intensity curves of main interest. The calibration procedure introduced here utilizes independent scaling of both the horizontal and vertical axes. The horizontal scaling calibration may not be considered to be crucial within this analysis because the data point shifts are not used to estimate light extraction enhancement. However, the vertical scaling is considered to be crucial within this analysis because the light extraction enhancement factors scale directly with this axis scaling.

Figure 12:
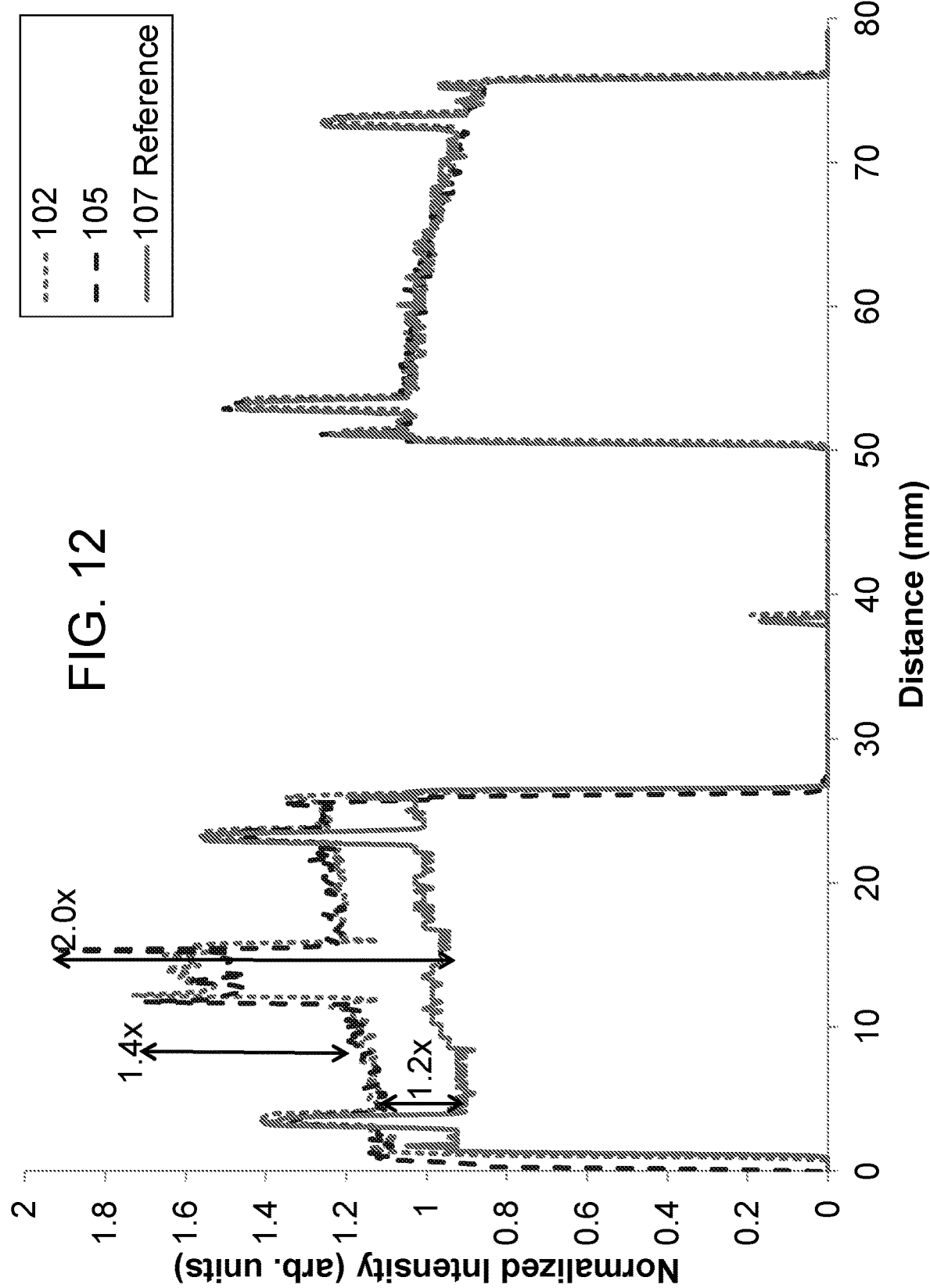

FIG. 12 shows the horizontal and vertical scaling results, along with light extraction estimates relative to sample 107. The horizontal scaling shift was obtained by manually matching the leading and trailing edges of the right-hand-side reference results. Determining the vertical scaling shift is obtained automatically by a calculation that normalized the right-hand-side reference results to a normalized intensity of 1.0. The enhancement factors shown on the left-hand-side results for samples 102 and 105 correspond to 1.2×, 1.4×, and 2.0×. The 2.0× peak may be the expected peak noted to indicate success of enhanced light extraction on FIG. 9, and may actually be higher than 2.0× because there is a limited resolution and therefore the highest peak may have been missed, and (2) no intentional glass texturing in the 5 mm wide ITO removed patterned region. The results strongly infer that there is a significant increase in light extraction from patterning the transparent conductor in this manner.

Electrical and operating lifetime degradations are not seen and are not expected because this patterning does not introduce any features not in the reference design. The waviness of the pattern design can be described by a single well-known parameter (i.e., a sinuosity index). A 3× light extraction enhancement is predicted to be achievable. 2× light extraction enhancement is observed at the patterned conductor edge of the surrogate. An enhancement of more than two times can be achieved via additional glass texturing in the patterned-transparent-conductor region and/or ILEL or ELEL layers.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. For example, FIGS. 3A and 3B are merely schematic illustrations of the layered structure of an OLED 200 according to one embodiment of the present disclosure. A variety of OLED configurations is contemplated herein, the structural details of which may be conveniently gleaned from the present description, the accompanying drawings, and the appended claims. FIGS. 3A and 3B are presented for illustrative purposes and are not intended to create a presumption that each of the various aspects illustrated therein are a necessary part of the various embodiments contemplated herein.

The claims appended hereto should be taken as the sole representation of the breadth of the present disclosure and the corresponding scope of the various embodiments described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present disclosure, it is noted that this term is introduced in the claims as an open-ended transitional phrase that is used to introduce a recitation of a series of characteristics of the structure and should be interpreted in like manner as the more commonly used open-ended preamble term "comprising."

It is also noted that recitations herein of "at least one" component, element, etc., should not be used to create an inference that the alternative use of the articles "a" or "an" should be limited to a single component, element, etc.

It is further noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

While the invention has been described with respect to a limited number of embodiments, those skilled in the art, having benefit of this disclosure, will appreciate that other embodiments can be devised that do not depart from the scope of the invention as disclosed herein. Accordingly, the scope of the invention should be limited only by the attached claims.

What is claimed is:

1. An article comprising:
    an approximately planar substrate;
    at least one approximately planar transparent electrode layer having a first surface and a second surface;
    the transparent electrode layer comprising an interrupted transparent conductive oxide structure having an index of refraction, $\eta_{tco}$, wherein the transparent conductive oxide structure has two or more discontinuities that contact at least the first surface of the transparent conductive oxide layer;
    the discontinuities comprising a material having an index of refraction,
    $\eta_v$, wherein
    $|\eta_v - \eta_{tco}| \geq 0.05$,
    such that the discontinuities act as scattering sites to reduce a waveguiding effect in the transparent electrode layer, and the discontinuities have a conductivity of less than $1 \times 10^{-3}$ S/m at 20° C.
    wherein the discontinuity have a width, a length, a depth and the spacing between the centers of discontinuities is a pitch and the ratio of the width to the pitch is <0.2.

2. The article of claim 1, wherein at least one of the discontinuities contacts both the first and second surfaces of the transparent conductive oxide layer.

3. The article of claim 1 wherein the discontinuities comprise a channel, a polyhedron, or a grid of channels or polyhedrons.

4. The article of claim 1, wherein the width is at least 5× the thickness of the transparent conductive oxide.

5. The article of claim 1, wherein the width is from 2× to 200× the thickness of the TCO layer, $t_{TCO}$.

6. The article of claim 1, wherein the pitch is from 10 nm≤P≤5 mm.

7. The article of claim 1, wherein the ratio of the width to the pitch is <0.1.

8. The article of claim 1, wherein the total surface area of the first surface of the transparent conductive oxide layer that comprises discontinuities is 50% or less.

9. The article of claim 8, wherein the total surface area of the first surface of the transparent conductive oxide layer that comprises discontinuities is 10% or less.

10. The article of claim 1, wherein $|\eta_{tco} - \eta_v|$ is from 0.1-1.0.

11. The article of claim 10, wherein $1 \leq \eta_v \leq 2.6$ at 600 nm.

12. The article of claim 1, wherein in $1.4 \leq \eta_{tco} \leq 2.1$ at 600 nm.

13. The article of claim 1, wherein the discontinuities have a conductivity of less than $1 \times 10^{-5}$ S/m at 20° C.

14. The article of claim 1, wherein the width and depth are defined by a wall, the wall having an angle, θ, wherein θ is from $30° < \theta \leq 90°$.

15. The article of claim 14, wherein the angle is from $45° < \theta \leq 85°$.

16. The article of claim 1, wherein the at least one discontinuity forms a pattern and the pattern is formed by a series of channels or polyhedrons.

17. The article of claim 16, wherein the pattern comprises at least one channel, the channel quantified by a sinuosity index $S_{TE}$, of $1 < S_{TE} \leq \pi/2$.

18. The article of claim 1, wherein the transparent conductive oxide layer has a thickness of 500 nm or less.

19. The article of claim 1, further comprising an approximately planar internal light extraction layer (ILEL) having a first surface and a second surface, the internal light extraction layer located between the planar substrate and the transparent electrode such that the first surface of the planar ILEL contacts the second surface of the transparent electrode.

20. The article of claim 1, wherein the discontinuities form a pattern that electrically separates the regions on opposite sides of the discontinuity.

* * * * *